United States Patent
Takano et al.

(10) Patent No.: US 8,129,836 B2
(45) Date of Patent: Mar. 6, 2012

(54) SEMICONDUCTOR DEVICE

(75) Inventors: Fumitomo Takano, Tochigi (JP);
Shinya Watanabe, Tochigi (JP);
Tsukasa Aiba, Tochigi (JP); Hiroshi Otsuka, Wako (JP); Joji Nakashima, Tochigi (JP)

(73) Assignee: Honda Motor Co., Ltd., Tokyo (JP)

( * ) Notice: Subject to any disclaimer, the term of this patent is extended or adjusted under 35 U.S.C. 154(b) by 421 days.

(21) Appl. No.: 12/303,865

(22) PCT Filed: May 17, 2007

(86) PCT No.: PCT/JP2007/060563
§ 371 (c)(1),
(2), (4) Date: Jan. 14, 2009

(87) PCT Pub. No.: WO2007/142038
PCT Pub. Date: Dec. 13, 2007

(65) Prior Publication Data
US 2010/0148298 A1    Jun. 17, 2010

(30) Foreign Application Priority Data

| Jun. 9, 2006 | (JP) | 2006-161616 |
| Jun. 9, 2006 | (JP) | 2006-161618 |
| Oct. 10, 2006 | (JP) | 2006-276906 |

(51) Int. Cl.
*H01L 23/52* (2006.01)
(52) U.S. Cl. ............ 257/691; 257/500; 361/624
(58) Field of Classification Search .......... 257/500, 257/691, E27.011, E27.018, E27.02, E27.022; 361/324, 624
See application file for complete search history.

(56) References Cited

U.S. PATENT DOCUMENTS

| 2001/0033477 A1 | 10/2001 | Inoue et al. |
| 2004/0195649 A1 | 10/2004 | Miura et al. |
| 2005/0128706 A1 | 6/2005 | Maly et al. |
| 2007/0051974 A1* | 3/2007 | Azuma et al. ............ 257/177 |

FOREIGN PATENT DOCUMENTS

| EP | 1 657 806 A2 | 5/2006 |
| JP | 2001-308263 A | 11/2001 |
| JP | 2004-31590 A | 1/2004 |
| JP | 2004-208411 A | 7/2004 |
| JP | 2004-214452 A | 7/2004 |
| JP | 2005-236108 A | 9/2005 |
| JP | 2006-134990 A | 5/2006 |
| JP | 2007-184525 A | 7/2007 |

* cited by examiner

*Primary Examiner* — Michael Lebentritt
*Assistant Examiner* — Daniel Whalen
(74) *Attorney, Agent, or Firm* — Arent Fox LLP

(57) ABSTRACT

A semiconductor device is composed of a pair of semiconductor chips (402, 404) arranged parallel on the same flat plane; a high voltage bus bar (21) bonded on the surface on the collector side of one semiconductor chip (402); a low voltage bus bar (23) connected to the surface on the emitter side of the other semiconductor chip (404) with a bonding wire (27); a first metal wiring board (24-1) connected to the surface on the emitter side of the semiconductor chip (402) with a bonding wire (26); a second metal wiring board (24-2) bonded on the surface on the collector side of the semiconductor chip (404); a third metal wiring board (24-3) connected to the first metal wiring board (24-1); a fourth metal wiring board (24-4) connected by being bent from an end portion of the second metal wiring board (24-2); and an output bus bar (24) having output terminals (405) extending from each end portion of the third metal wiring board (24-3) and that of the fourth metal wiring board (24-4).

5 Claims, 8 Drawing Sheets

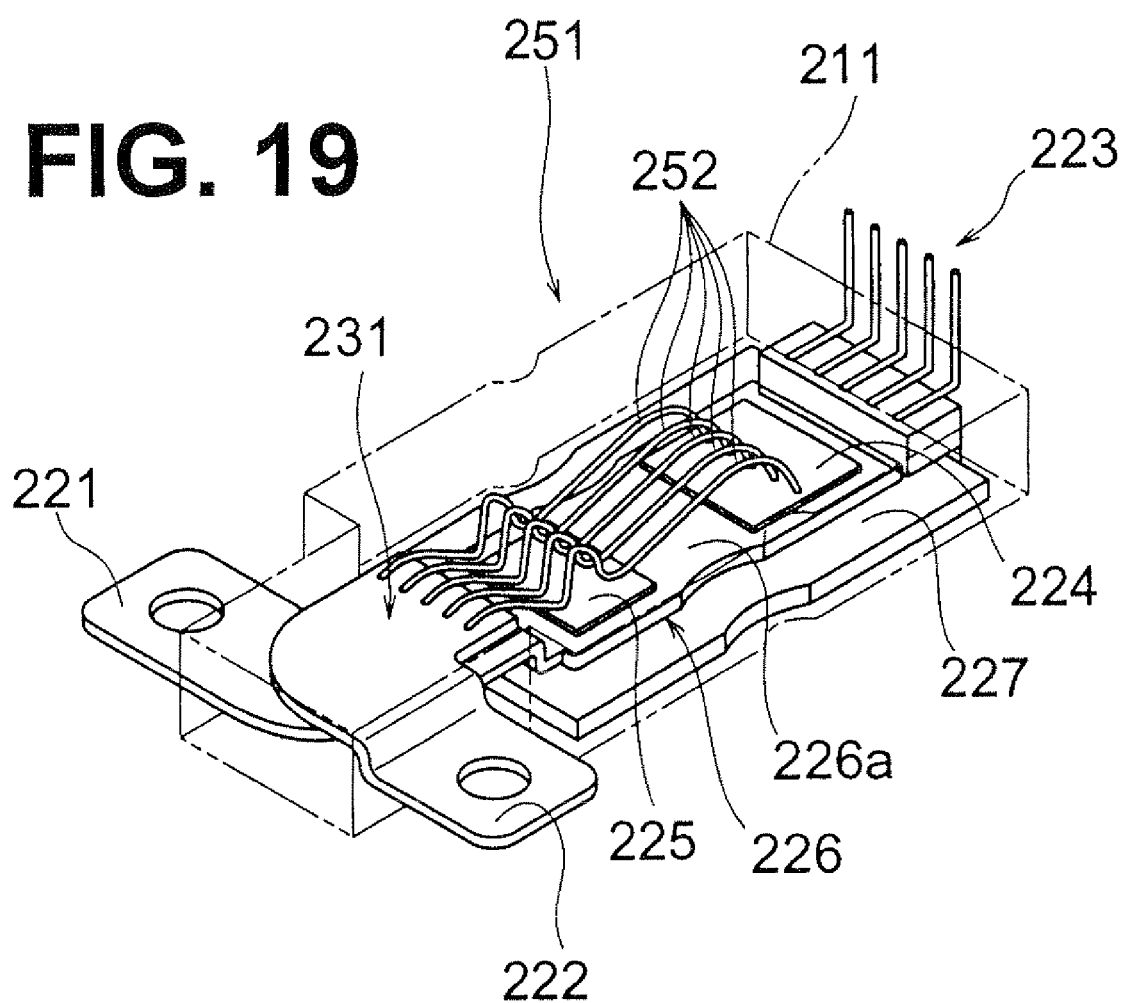

SEMICONDUCTOR DEVICE

CROSS REFERENCE TO RELATED APPLICATION

This application is a National Stage entry of International Application No. PCT/JP2007/060563, filed May 17, 2007, and which claims priority from Japanese Patent Application 2006-161616 filed Jun. 9, 2006, Japanese Patent Application files Jun. 9, 2006 and Japanese Patent Application 2006-276906 filed Oct. 10, 2006. The disclosure of these prior applications are hereby incorporated herein, their entirety by reference.

TECHNICAL FIELD

The present invention relates to a semiconductor device and, more particularly, to a power semiconductor device that includes an IGBT module or the like used in a drive circuit for driving a driving motor of an electric vehicle.

BACKGROUND ART

Inverter devices are used to drive the driving motors of electric automobiles and other electric vehicles. These inverter devices include an electrical circuit in which switching elements are connected using a bridge-circuit configuration. Inverter devices turn the switching elements of the bridge circuit on and off as appropriate and execute the switching of current made to flow to the driving motor. Power transistors, IGBT, FET, IEGT, and the like are widely used as the switching elements (power semiconductor elements) that constitute the bridge circuit. These inverter devices are usually configured in a modular structure in which a plurality of switching elements is housed in one package.

The operation of the driving motor of an electric vehicle is characterized in that a large current flows to the switching elements that constitute the bridge circuit, and a surge voltage is generated from the on/off operation. The length of the wiring that constitutes the electric current pathway is therefore made as short as possible when the plurality of switching elements is mounted inside one package in the inverter device, whereby resistance in the wiring is minimized, and the value of the inductance that is an electrical characteristic of alternating current is reduced.

A well-known example of a conventional semiconductor device having a modular structure similar to the aforedescribed inverter device is the semiconductor device described in Japanese Patent Application Laid-Open Publication No. 2002-026251 (JP 2002-026251 A). The semiconductor device described in JP 2002-206251 A has three electric terminals: a high-voltage external electric terminal, a low-voltage external electric terminal, and an output external electric terminal. These three electric terminals all have a rectangular plate shape as the planar shape and are positioned in an overlaid state with gaps in between so as to be positioned in parallel. The output external electric terminal is positioned between the high-voltage external electric terminal and the low-voltage external electric terminal. The structure is such that semiconductor chips (switching elements or the like) are sandwiched between two adjacent electrical terminals from among the three electrical terminals. The high-voltage external electric terminal and the low-voltage external electric terminal are formed to extend towards the same end, and the output external electric terminal between these terminals is formed to extend towards the other end on the opposite side.

The connection between the semiconductor chips and the electrical terminals in the semiconductor device described in Japanese Laid-open Patent Application No. 2002-26251 bridges a short distance, and therefore voltage drops resulting from internal wiring are reduced. This semiconductor device is also characterized in that the direction of current flowing to the high-voltage external electric terminal and the direction of current flowing to the low-voltage external electric terminal are opposite, and therefore the orientations of the magnetic fields generated by those currents are opposite, and inductance can be reduced.

The inverter device of a three-phase motor is provided with a high-side (high-voltage) semiconductor chip and a low-side (low-voltage) semiconductor chip for each of the U, V, and W phases and contains a total of six semiconductor chips. This inverter device is provided with a semiconductor module in which two semiconductor chips, high-side and low-side, are packaged for each phase. The high-side semiconductor chip and the low-side semiconductor chip of this semiconductor module will not short circuit during use in controlling a motor, and therefore current will not flow to the high-voltage electrical terminal and the low-voltage electrical terminal at the same time. In other words, the bridge circuit either contains an electric current pathway from the high-voltage electrical terminal through a semiconductor chip to the output electrical terminal, or an electric current pathway from the output electrical terminal through a semiconductor chip to the low-voltage electrical terminal. A problem is therefore presented in that reducing inductance is difficult when the configuration of the semiconductor device described in JP 2002-026251 A is applied to controlling a motor using the inverter device of a three-phase motor.

The semiconductor devices used in inverter devices are usually provided with a plurality of bus bars, e.g., a high-voltage bus bar, a low-voltage bus bar, and an output bus bar. These bus bars all have different shapes. Problems therefore result in the fabrication of the inverter device in that the number of components that constitute the semiconductor device increases, and the handling of the components by workers is also complicated.

The ability to reduce the inductance of the main circuit in the structure of a semiconductor module in which a plurality of semiconductor chips is mounted in one package has therefore been needed in the aforedescribed semiconductor device.

The ability to reduce the number of components, use fewer molds, improve yield, reduce the assembly workforce, and greatly reduce cost is also needed for the aforedescribed semiconductor device.

DISCLOSURE OF THE INVENTION

According to a first aspect of the present invention, there is provided a semiconductor device, comprising a pair of semiconductor chips composed of a high-side and a low-side semiconductor chip that constitute a bridge circuit of an inverter device and that are placed next to each other in the same plane; a high-voltage bus bar that is bonded to one surface of the high-side semiconductor chip and that has a high-voltage terminal; a low-voltage bus bar that is connected to one surface of the other, low-side semiconductor chip using a bonding wire and that has a low-voltage terminal; a first metal wiring board that is connected to another surface of the first semiconductor chip using a bonding wire; a second metal wiring board that is bonded to another surface of the other semiconductor chip; a third metal wiring board that is linked to the first metal wiring board, is separated by a prescribed interval from the bonding wire connected to the other surface of the first semiconductor chip, and is positioned parallel to the high-voltage bus bar; a fourth metal wiring board that is linked by being bent from an end portion of the second metal wiring board, is separated by a prescribed interval from the bonding wire connected to the other semiconductor chip, and is positioned parallel to the second metal wiring board; and an output bus bar having an output terminal extending from each end portion of the third metal wiring board and of the fourth metal wiring board.

When the power semiconductor elements of the semiconductor chips are IGBT elements (N-channel type), the first surface of the first semiconductor chip is a collector-side surface, the other surface is an emitter-side surface, the first surface of the other semiconductor chip is an emitter-side surface, and the other surface is a collector-side surface.

According to the aforedescribed structure of a semiconductor-element module that is composed of the high-side and low-side semiconductor chips that constitute the bridge circuit of the inverter device, the high-side electric current pathway and the low-side electric current pathway are both configured so that current flows back and forth in opposite directions. The magnetic field generated around the high-voltage bus bar and the first metal wiring board is negated, and the magnetic field generated around the low-voltage bus bar and the second metal wiring board is also negated. The inductance of the main circuit in the structure of the semiconductor module is thereby reduced. The magnetic field generated around the high-voltage bonding wire and the third metal wiring board is also negated, and the magnetic field around the low-voltage bonding wire and the fourth metal wiring board is negated, as well.

The high-voltage terminal of the high-voltage bus bar and the low-voltage terminal of the low-voltage bus bar are preferably on the same side, and the output terminal of the output bus bar is preferably positioned in an intermediate location on an electric current pathway between the high-voltage terminal and the low-voltage terminal.

The first metal wiring board and the third metal wiring board are preferably formed as separate members, the second metal wiring board and the fourth metal wiring board are preferably formed as separate members, and the output bus bar is preferably bonded to a bonding portion between the third metal wiring board and the fourth metal wiring board. According to this configuration, assembly is facilitated, and wire bonding is more easily performed.

A metal spacer is preferably provided between the first metal wiring board and the third metal wiring board and between the second metal wiring board and the fourth metal wiring board; and a gap between the third metal wiring board and the bonding wire as well as a gap between the fourth metal wiring board and the bonding wire are preferably configured to be adjustable.

Both of the pair of semiconductor chips are preferably provided with a power semiconductor element and a rectifier semiconductor element; when the semiconductor device is driven so that a greater portion of current flows to the power semiconductor elements relative to the rectifier semiconductor elements, the power semiconductor element of the first semiconductor chip is preferably positioned closer to the high-voltage terminal via the high-voltage bus bar, and the power semiconductor element of the other semiconductor chip is preferably positioned farther from the low-voltage terminal via the second metal wiring board; and, when the semiconductor device is driven so that a lesser portion of current flows to the power semiconductor elements relative to the rectifier semiconductor elements, the power semiconductor device of the first semiconductor chip is preferably positioned farther from the high-voltage terminal via the high-voltage bus bar, and the power semiconductor element of the other semiconductor chip is preferably positioned closer to the low-voltage terminal via the second metal wiring board.

According to a second aspect of the present invention, there is provided a semiconductor device, comprising a pair of semiconductor chips composed of a high-side and a low-side semiconductor chip that constitute a bridge circuit of an inverter device and that are placed next to each other in the same plane; a high-voltage bus bar that is bonded to one surface of one of the semiconductor chips and that has a high-voltage terminal; a low-voltage bus bar that is bonded to one surface of the other semiconductor chip and that has a low-voltage terminal; a first metal wiring board that is bonded to another surface of the first semiconductor chip; a second metal wiring board that is bonded to another surface of the other semiconductor chip; and an output bus bar having an output terminal extending from each end portion of the first metal wiring board and of the second metal wiring board.

According to the aforedescribed structure of a semiconductor-element module that is composed of the high-side and low-side semiconductor chips that constitute the bridge circuit of the inverter device, the high-side electric current pathway and the low-side electric current pathway are both configured so that current flows back and forth in opposite directions. The magnetic field generated around the high-voltage bus bar and the first metal wiring board is negated, and the magnetic field generated around the low-voltage bus bar and the second metal wiring board is also negated. The inductance of the main circuit in the structure of the semiconductor module is thereby reduced.

The high-voltage terminal of the high-voltage bus bar and the low-voltage terminal of the low-voltage bus bar are preferably positioned on the same side, and the output terminal of the output bus bar is preferably positioned in an intermediate location on an electric current pathway between the high-voltage terminal and the low-voltage terminal.

The first metal wiring board and the second metal wiring board are preferably formed as separate members, and the output bus bar is preferably bonded to a bonding portion between the first metal wiring board and the second metal wiring board. In this configuration, assembly is facilitated, and bonding can be performed so that the semiconductor chips are not placed under stress.

A length of an electric current pathway from the high-voltage terminal through the first semiconductor chip to the output terminal, and a length of an electric current pathway from the low-voltage terminal through the other semiconductor chip to the output terminal are preferably substantially equal. The electrical characteristics of the high-side semiconductor chip and the electrical characteristics of the low-side semiconductor chip can be made equal in this configuration.

In the aforedescribed semiconductor device, both of the pair of semiconductor chips are preferably provided with a power semiconductor element and a rectifier semiconductor element; when the semiconductor device is driven so that a greater portion of current flows to the power semiconductor elements relative to the rectifier semiconductor elements, the power semiconductor element of the first semiconductor chip is preferably positioned farther from the high-voltage terminal via the high-voltage bus bar, and the power semiconductor element of the other semiconductor chip is preferably positioned farther from the low-voltage terminal via the second metal wiring board; and, when the semiconductor device is driven so that a lesser portion of current flows to the power semiconductor elements relative to the rectifier semiconductor elements, the power semiconductor device of the first semiconductor chip is preferably positioned closer to the high-voltage terminal via the high-voltage bus bar, and the power semiconductor element of the other semiconductor chip is preferably positioned closer to the low-voltage terminal via the second metal wiring board. More current flows to the power semiconductor elements primarily when the motor is in power-running mode, but the portion of the bus bar from the high-voltage terminal to the power semiconductor element is lengthened, whereby the parallel portions are lengthened, and inductance can be farther reduced. The amount of current flowing to the rectifier semiconductor elements will increase during regeneration, field weakening, and the like, but inductance can similarly be reduced in these instances.

According to a third aspect of the present invention, there is provided a semiconductor device, comprising a power semiconductor element and a rectifier semiconductor element that are positioned on a predetermined surface; a first bus bar having a first bonding portion that is bonded to surfaces of the power semiconductor element and the rectifier semiconductor element, and having a first terminal that is extended in a direction perpendicular to a lengthwise direction of the first bonding portion; and a second bus bar having a second bonding portion that has a connecting-strip portion that is bonded to other surfaces of the power semiconductor element and the rectifier semiconductor element, and having a second terminal that is extended in a direction perpendicular to a lengthwise direction of the second bonding portion and in an opposite direction from the first terminal.

The magnetic field generated around the first bus bar and the second bus bar is negated in this configuration. The inductance of the main circuit in the structure of the semiconductor module can thereby be reduced. The aforedescribed semiconductor device can be used as a basic unit element and, when configuring the bridge circuit of an inverter device, can be implemented as a semiconductor device in which the electrical circuit portions of each arm have the same configuration.

The second bus bar preferably connects the second terminal to the power semiconductor element and the rectifier semiconductor element using a plurality of wires instead of the second bonding portion.

The first terminal and the second terminal preferably both have a front surface and a rear surface and are provided so that the rear surfaces of the first terminal and the second terminal form a uniform surface.

The first terminal and the second terminal preferably both have a front surface and a rear surface and are provided so that the front surface of the first terminal and the rear surface the second terminal are positioned along the same plane and have an overlapping portion.

The first bus bar and the second bus bar preferably have a planar shape and are positioned so as to have symmetric shapes relative to a shared center line in a lengthwise direction.

In a preferable aspect, when the semiconductor device is driven so that a greater portion of current flows to the power semiconductor element relative to the rectifier semiconductor element, the power semiconductor element is preferably positioned farther from the first terminal via the first bus bar; and, when the semiconductor device is driven so that a lesser portion of current flows to the power semiconductor element relative to the rectifier semiconductor element, the power semiconductor device is preferably positioned closer to the first terminal via the first bus bar.

The semiconductor device of the present invention preferably comprises a first arm circuit portion having the power semiconductor element, the rectifier semiconductor element, the first bus bar, and the second bus bar; and a second arm circuit portion having the power semiconductor element, the rectifier semiconductor element, the first bus bar, and the second bus bar, wherein the second terminal of the second bus bar of the first arm circuit portion and the first terminal of the first bus bar of the second arm circuit portion are electrically connected and form an output terminal; the first terminal of the first bus bar of the first arm circuit portion is a high-voltage terminal; and the second terminal of the second bus bar of the second arm circuit portion is a low-voltage terminal.

According to the structure of the semiconductor-element module that is composed of the high-side (first arm circuit) and low-side (second arm circuit) semiconductor chips that constitute the bridge circuit of the inverter device in the aforedescribed semiconductor device, the high-side electric current pathway and the low-side electric current pathway are both configured so that current flows back and forth in opposite directions. The magnetic field generated around the high-voltage first bus bar and the output bus bar is negated, and the magnetic field generated around the low-voltage second bus bar and the output bus bar is also negated. The inductance of the main circuit in the structure of the semiconductor module is thereby reduced.

The second terminal of the second bus bar of the first arm circuit portion and the first terminal of the first bus bar of the second arm circuit portion preferably both have a front surface and a rear surface; the rear surface of the second terminal of the second bus bar of the first arm circuit portion and the front surface of the first terminal of the first bus bar of the second arm circuit portion are preferably positioned along the same plane and have an overlapping portion; and the second terminal and the first terminal are preferably pressure welded together and thereby electrically connected.

A length of an electric current pathway in the first arm circuit portion from the first terminal of the first bus bar to the second terminal of the second bus bar and a length of an electric current pathway in the second arm circuit portion from the first terminal of the first bus bar to the second terminal of the second bus bar are preferably substantially equal.

When the semiconductor device is driven so that a greater portion of current flows to the power semiconductor elements relative to the rectifier semiconductor elements, the power semiconductor element of the first arm circuit portion is preferably positioned farther from the first terminal via the first bus bar, and the power semiconductor element of the second arm circuit portion is preferably positioned farther from the second terminal via the second bus bar; and, when the semiconductor device is driven so that a lesser portion of current flows to the power semiconductor elements relative to the rectifier semiconductor elements, the power semiconductor device of the first arm circuit portion is preferably positioned closer to the first terminal via the first bus bar, and the power semiconductor element of the second arm circuit portion is preferably positioned closer to the second terminal via the second bus bar.

In this configuration, more current flows to the power semiconductor elements primarily when the motor is in power-running mode, but the portion of the bus bar from the high-voltage terminal to the power semiconductor element is lengthened, whereby the parallel portions are lengthened, and inductance can be farther reduced. The amount of current flowing to the rectifier semiconductor elements will increase during regeneration, field weakening, and the like, but inductance can be similarly reduced in these instances.

In the semiconductor-element module that is composed of the high-side and low-side semiconductor chips that constitute the bridge circuit of the inverter device in the configuration according to the first aspect of the present invention, the wiring pathway portion from the high-voltage terminal to the high-side semiconductor chip and the wiring pathway portion from that semiconductor chip to the output terminal are positioned in parallel and are configured so that the respective currents flow back and forth in opposite directions. The inductance of the high-voltage bus bar and other circuit portions can therefore be reduced. In the same semiconductor-element module, the wiring pathway portion from the output terminal to the low-side semiconductor chip and the wiring pathway portion from that semiconductor chip to the low-voltage terminal are positioned in parallel and are configured so that the respective currents flow back and forth in opposite directions. The inductance of the low-voltage bus bar and other circuit portions can therefore be reduced. Since the inductance can be reduced in the main circuit of the semiconductor-element module as described above, the switching loss and the surge voltage occurring during switching operations in the inverter device can be reduced.

In the configuration according to the second aspect of the present invention, the inductance of circuits such as the high-voltage bus bar and the inductance of circuits such as the low-voltage bus bar can be reduced, and the switching loss and the surge voltage occurring during switching operations in the inverter device can be reduced, as in the configuration according to the first aspect.

In the semiconductor-element module that is composed of the high-side (first arm circuit portion) and low-side (second arm circuit portion) semiconductor chips that constitute the bridge circuit of the inverter device in the configuration according to the third aspect of the present invention, the wiring pathway portion from the high-voltage terminal to the high-side semiconductor chip and the wiring pathway portion from that semiconductor chip to the output terminal are positioned in parallel and are configured so that the respective currents flow back and forth in opposite directions. The inductance of the high-voltage bus bar and other circuit portions can therefore be reduced.

The inductance of the low-voltage bus bar and other circuit portions can also be reduced, and the switching loss and the surge voltage occurring during switching operations in the inverter device can be reduced.

The same types of bus bar members may be employed as the high-voltage bus bar, low-voltage bus bar, output bus bar, and the like that constitute the semiconductor-element module, and manufacture is possible after preparing only two types of bus bar members. The number of components can therefore be reduced, fewer molds can be used, yield can be improved, the assembly workforce can be reduced, and significant reductions in cost can be achieved when manufacturing the semiconductor device of an inverter device.

BRIEF DESCRIPTION OF THE DRAWINGS

FIG. 19 is a perspective view illustrating another modification of the IGBT module according to the third embodiment.

BEST MODE FOR CARRYING OUT THE INVENTION

The preferred embodiments of the present invention are described below with reference to the accompanying drawings.

Embodiment 1

The first embodiment of the semiconductor device according to the present invention will be described with reference to FIGS. 1 through 5.

The semiconductor device described in the present embodiment is a power semiconductor device, and is typically an inverter device for driving a three-phase motor that drives an electric vehicle. The IGBT module shown in FIG. 1 displays the main portions of the inverter device. The configuration of the electrical circuit of the IGBT module will be described first with reference to FIG. 4.

Figure 4:
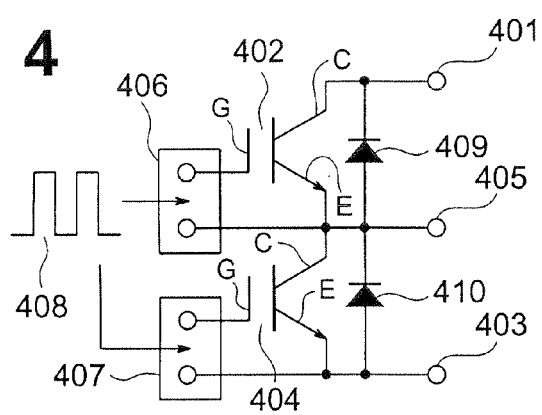
FIG. 4 is a circuit diagram of an electrical circuit of the IGBT module of FIG. 1.

FIG. 4 shows the electrical circuit portions of a single phase (one phase from among the U, V, or W phases) of the bridge circuit of the inverter device. The electrical circuit shown in FIG. 4 includes a high-side IGBT element 402 positioned near a high-voltage terminal 401 and a low-side IGBT element 404 positioned near a low-voltage terminal 403. The semiconductor elements used in the semiconductor device according to the present embodiment are not limited to IGBT elements, and any power semiconductor element may be used. The bridge circuit of the inverter device is configured using six power semiconductor elements, but one module is formed by a pair of higher and lower power semiconductor elements.

The collector (C) of the IGBT element 402 is connected to the high-voltage terminal 401. The emitter (E) of the IGBT element 402 is connected to the collector (C) of the IGBT element 404, and this connection point is connected to an output terminal 405. The emitter (E) of the IGBT element 404 is connected to the low-voltage terminal 403.

Signal connectors 406, 407 are connected between the gates (G) and the emitters (E) of the two IGBT elements 402, 404. A driving-control rectangular pulse signal 408 for turning the IGBT elements 402, 404 on and off at an appropriate timing is input between the input terminals of the signal connectors 406, 407. Rectifying diode elements 409, 410 are connected between the respective emitters (E) and collectors (C) of the two IGBT elements 402, 404.

The physical structure of the IGBT module having the aforedescribed electrical-circuit configuration will be described next with reference to FIGS. 1 through 3.

Figure 1:
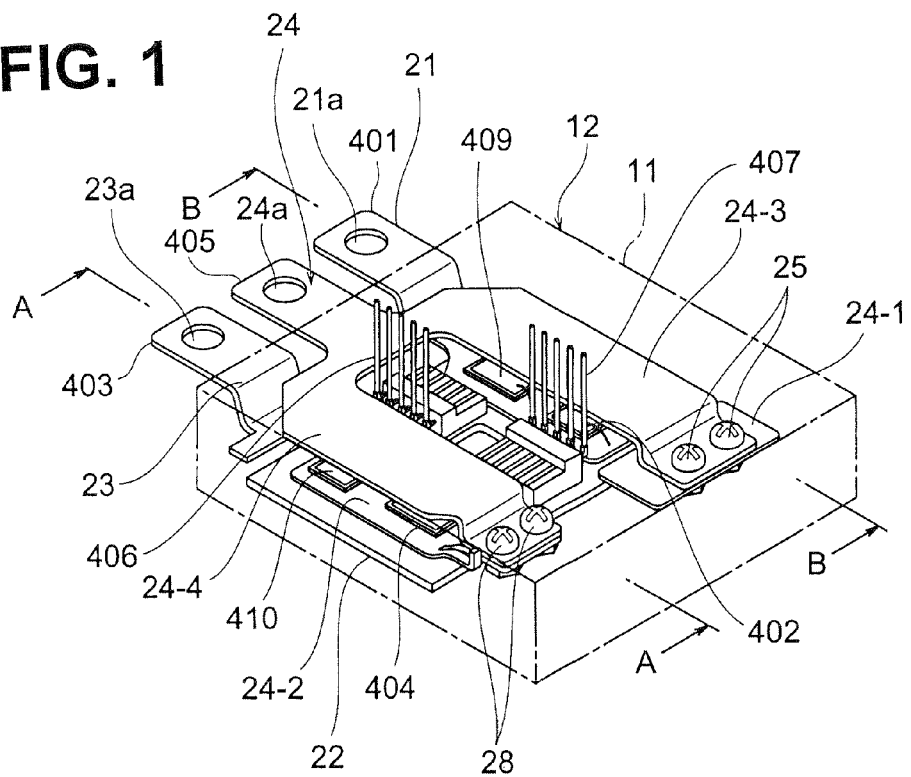
FIG. 1 is a perspective view illustrating a semiconductor device according to a first embodiment of the present invention and, in particular, an external appearance of a modular structure of an IGBT module.

A block 11 shown by the alternatingly dotted line in FIG. 1 designates the external shape of the package that forms an IGBT module 12. The block 11 is substantially molded from resin. The portions designated by solid lines in FIG. 1 are the physical structure portions of the wiring board. The same notation is applied to elements that are substantially identical to the elements of the electrical circuit described using FIG. 4.

In FIG. 1, the portion designated by "401" is the aforedescribed high-voltage terminal, the portion designated by "403" is the aforedescribed low-voltage terminal, and the portion designated by "405" is the aforedescribed output terminal. "406" and "407" are the respective aforedescribed signal connectors. The "402" and "404" portions are the aforedescribed IGBT elements, and the "409" and "410" portions are the aforedescribed diode elements. In FIGS. 1 through 3, the IGBT elements 402, 404 have an upright structure, the emitters and gates are formed on the upper surfaces, the collectors are formed on the lower surfaces, the anodes of the diode elements 409, 410 are formed on the upper surfaces, and the cathodes thereof are formed on the lower surfaces.

The high-voltage terminal 401 constitutes an end portion of a high-voltage bus bar 21 and is the external end portion of the high-voltage bus bar 21 extending to the exterior of the block 11. The high-voltage bus bar 21 is a wiring member that overall has a rectangular plate shape. The high-voltage bus bar is a wiring member that is positioned towards the high-voltage terminal 401. As shown in FIGS. 1 and 3, the high-voltage bus bar 21 is formed in a flat plate shape for a prescribed distance beyond the high-voltage terminal 401 and is bent downwards from the middle. The right-half portion of the high-voltage bus bar in FIG. 3 is also formed in a flat plate shape. As shown in FIG. 3 and the like, a hole 21a is formed in the high-voltage terminal 401 of the high-voltage bus bar 21, and a right-half portion 21b is fixed onto an insulating layer 22. The insulating layer 22 is, e.g., an epoxy or insulating oxide film.

The low-voltage terminal 403 constitutes an end portion of a low-voltage bus bar 23 and is the external end portion of the low-voltage bus bar 23 extending to the exterior of the block 11. The low-voltage bus bar 23 is also a wiring member that overall has a rectangular plate shape. The low-voltage bus bar is a wiring member that is positioned towards the low-voltage terminal 403. As shown in FIGS. 1 and 2, the low-voltage bus bar 23 is formed in a flat plate shape for a prescribed distance beyond the low-voltage terminal 403, is bent slightly downwards from the middle, and is fixed onto the insulating layer 22. As shown in FIG. 2 and the like, a hole 23a is formed located in the low-voltage terminal 403 of the low-voltage bus bar 23.

The output terminal 405 constitutes an end portion of an output bus bar 24 and is the external end portion of the output bus bar 24 extending to the exterior of the block 11. The output bus bar 24 overall has a substantially elongated shape, and the principal portion thereof has a Y-shaped plate form. A hole 24a is also formed located in the output terminal 405 of the output bus bar 24.

Figure 2:
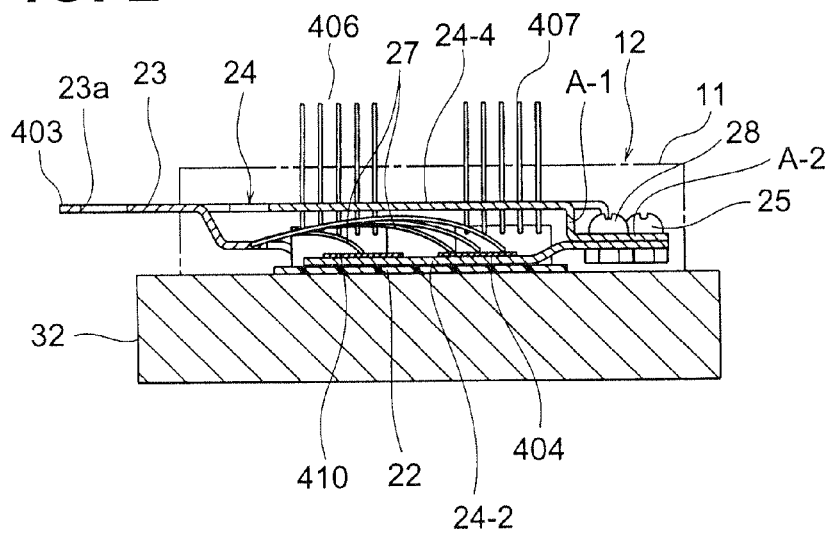
FIG. 2 is a cross-sectional view taken along line A-A of FIG. 1.
Figure 3:
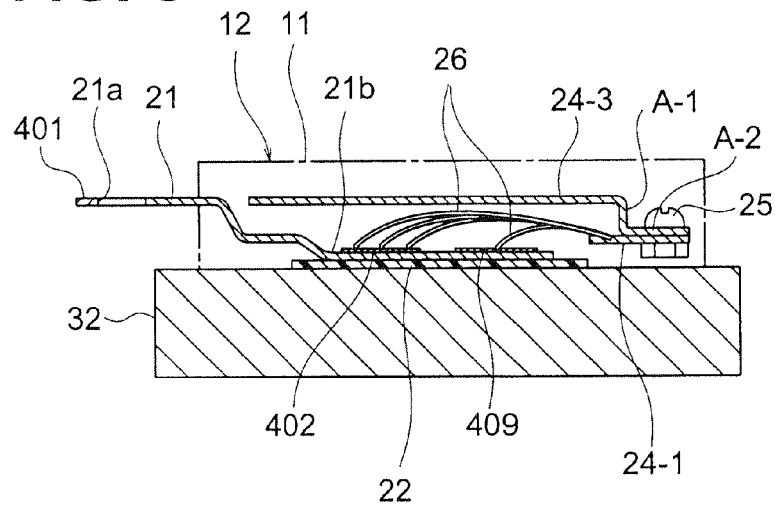
FIG. 3 is a cross-sectional view taken along line B-B of FIG. 1.

As shown in FIGS. 1 through 3, the IGBT module 12 has a first metal wiring board 24-1, a second metal wiring board 24-2, a third metal wiring board 24-3, and a fourth metal wiring board 24-4 as wiring members. These first through fourth metal wiring boards are wiring elements that form the aforedescribed output bus bar 24. The Y-shaped portion of the output bus bar 24 in particular is formed from the third metal wiring board 24-3 and the fourth metal wiring board 24-4.

The plate-shaped high-voltage terminal 401 of the high-voltage bus bar 21, the plate-shaped low-voltage terminal 403 of the low-voltage bus bar 23, and the plate-shaped output terminal 405 of the output bus bar 24 in the description above are placed next to each other so as to be positioned in the same plane located on the same side of the IGBT module 12. The output terminal 405 is positioned so as to be located in an intermediate position on the electric current pathway between the high-voltage terminal 401 and the low-voltage terminal 403. The length of the electric current pathway from the high-voltage terminal 401 through the high-side IGBT element 402 to the output terminal 405 and the length of the electric current pathway from the output terminal 405 through the low-side IGBT element 404 to the low-voltage terminal 403 are thereby made substantially equal. The high-side and low-side electrical characteristics are thereby made substantially equal, which is advantageous in terms of improving the output characteristics of the motor. Were the output terminal 405 to be positioned on the opposite side from the high-voltage terminal 401 and the low-voltage terminal 403, the output terminal 405 would have to be bent and extended toward the opposite side. As a result, the member that forms the output terminal would be lengthened, and the length of wiring unrelated to decreasing inductance would be increased; therefore, a drawback is presented in that resistance would increase. The output terminal 405 of the present embodiment is advantageous in being devoid of such a drawback.

The plate shapes of the bus bars the aforedescribed high-voltage bus bar 21, low-voltage bus bar 23, and output bus bar 24 have a width of, e.g., 20 mm, and a thickness of, e.g., 0.5 mm.

The electrical connectivity relationships of the IGBT elements 402, 404 and the diode elements 409, 410 will be described next. These connectivity relationships are constructed using wiring from the high-voltage bus bar 21, the low-voltage bus bar 23, the output bus bar 24, and the first through fourth metal wiring boards 24-1, 24-2, 24-3, 24-4.

The high-voltage (high-side) IGBT element 402 and the diode element 409 are attached on top of the high-voltage bus bar 21. The respective lower surfaces of the IGBT element 402 and the diode element 409, i.e., the surface on the collector side of the IGBT element 402 and the surface on the cathode side of the diode element 409, are soldered or otherwise bonded to the high-voltage bus bar 21. The diode element 409 is positioned in a location far from the high-voltage terminal 401, and the IGBT element 402 is positioned in a location close to the high-voltage terminal 401. The high-voltage bus bar 21 is a wiring member that is connected to the high-voltage terminal 401. The cathode of the diode element 409 and the collector of the IGBT element 402 are both electrically connected to the high-voltage bus bar 21.

The third metal wiring board 24-3 is positioned with the necessary spacing on the upper side of the aforedescribed diode element 409 and high-side IGBT element 402. The third metal wiring board 24-3 is substantially plated-shaped, and one end thereof is connected to the output bus bar 24. The first metal wiring board 24-1 is joined to the other end of the third metal wiring board 24-3 by a screw fastener 25. The joining portion formed using the screw fastener 25 may also be joined using another means, e.g., ultrasonic bonding, soldering, or crimping. The upper surfaces of the aforedescribed diode element 409 and IGBT element 402, i.e., the anode of the diode element 409 and the emitter and gate of the IGBT element 402, may all be connected to the first metal wiring board 24-1 by a bonding wire 26, as shown in FIG. 3.

The low-voltage (low-side) IGBT element 404 and the diode element 410 are attached on top of the second metal wiring board 24-2 fixed on top of the insulating layer 22, as shown in FIG. 2. The respective lower surfaces of the IGBT element 404 and the diode element 410, i.e., the surface on the collector side of the IGBT element 404 and the surface on the cathode side of the diode element 410, are soldered or otherwise bonded to the second metal wiring board 24-2. The low-voltage bus bar 23 is a wiring member that is connected to the low-voltage terminal 403. The low-voltage bus bar 23 is connected to the anode on the upper surface of the diode element 410 and to the emitter and gate on the upper surface of the IGBT element 404 by a bonding wire 27. The diode element 410 is positioned in a location close to the low-voltage terminal 403, and the IGBT element 404 is positioned in a location far from the low-voltage terminal 403.

The second metal wiring board 24-2 is electrically connected to the cathode on the lower surface of the diode element 410 and to the gate and collector of the IGBT element 404. One end of the second metal wiring board 24-2 is joined to the fourth metal wiring board 24-4 by a screw fastener 28. The joining portion formed using the screw fastener 28 may also be joined using another means, e.g., ultrasonic bonding, soldering, or crimping.

The joining portion of the first metal wiring board 24-1 and the third metal wiring board 24-3, as well as the joining portion of the second metal wiring board 24-2 and the fourth metal wiring board 24-4 will be described hereunder.

As concerns the aforedescribed joining portions, the joining end portion of the third metal wiring board 24-3 and the joining end portion of the fourth metal wiring board 24-4 are both formed as L-shaped bending portions forming downward-facing steps, as shown in FIG. 2 or 3. The joining end portion of the third metal wiring board 24-3 and the joining end portion of the fourth metal wiring board 24-4 both have a vertical portion A-1 and a horizontal portion A-2 that form L-shapes, as shown in FIG. 2 or 3. The horizontal portion A-2 contacts the joining end portion of the corresponding metal wiring board and is the portion to be joined. The space between the bonding wire 26 and the third metal wiring board 24-3 or the space between the bonding wire 27 and the fourth metal wiring board 24-4 can be changed by changing the length of the vertical portion A-1 in the vertical direction.

When L-shaped bending portions forming upward-facing steps are formed on the joining end portions of the second metal wiring board 24-2 and the first metal wiring board 24-1 positioned below, the space between a heat sink 32 and horizontal portions as described above will widen, and a chip head for ultrasonic bonding, crimping, or other bonding will be easily put in position.

The positional relationship between the high-side IGBT element 402 and the high-voltage terminal 401 of the diode element 409, and the positional relationship between the low-side IGBT element 404 and the low-voltage terminal 403 of the diode element 410 described above are relationships of proximity and distance opposite the respective terminals.

In this case, when the semiconductor device is driven so that a greater portion of current flows to the IGBT elements relative to the diode elements, the IGBT element of one semiconductor chip is positioned closer to the high-voltage terminal via the high-voltage bus bar, and the IGBT element of the other semiconductor chip is positioned farther from the low-voltage terminal via the second metal wiring board. On the other hand, when the semiconductor device is driven so that a lesser portion of current flows to the IGBT elements relative to the diode elements, the IGBT element of one semiconductor chip is positioned farther from the high-voltage terminal via the high-voltage bus bar, and the IGBT element of the other semiconductor chip is positioned closer to the low-voltage terminal via the second metal wiring board.

The heat sink 32 is provided below the insulating layer 22, i.e., below the block 11 that forms the IGBT module 12, as shown in FIGS. 2 and 3. The heat sink 32 is omitted in FIG. 1.

In the IGBT module 12 having the aforedescribed structure, the diode element 409 and the IGBT element 402 towards the high-voltage terminal 401 form the high-voltage (high-side) semiconductor chip, and the diode element 410 and the IGBT element 404 towards the low-voltage terminal 403 form the low-voltage (low-side) semiconductor chip. The physical positional relationship between the pair of semiconductor chips is such that the semiconductor chips are placed next to each other in the same plane.

In the aforedescribed structure, the first metal wiring board 24-1 and the third metal wiring board 24-3, as well as the low-voltage bus bar 23 and the high-voltage bus bar 21, which are positioned parallel to the semiconductor chips, all have a parallel positional relationship, and the distances therebetween are set to be as small as possible. The bus-bar structure of the high-voltage arm and the bus-bar structure of the low-voltage arm have a top-bottom relationship that is reversed relative to the semiconductor chips and have a symmetric positional relationship. The circuit inductance, circuit resistance, and other electrical properties are therefore the same for both the high-voltage arm and the low-voltage arm.

The third metal wiring board 24-3 in the description above is separated by a prescribed interval from the bonding wire 26 and is the metal wiring board positioned parallel to the high-voltage bus bar 21. The fourth metal wiring board 24-4 is bent back and linked from the end portion of the second metal wiring board 24-2, is separated by a prescribed interval from the bonding wire 27, and is the metal wiring board positioned parallel to the second metal wiring board 24-2.

Metal spacers having the desired thickness can be provided between the first metal wiring board 24-1 and the third metal wiring board 24-3 and between the second metal wiring board 24-2 and the fourth metal wiring board 24-4 in the aforedescribed structure. According to this structure, the gap between the third metal wiring board 24-3 and the bonding wire 26 and the gap between the fourth metal wiring board 24-4 and the bonding wire 27 can be appropriately adjusted.

Figure 5:
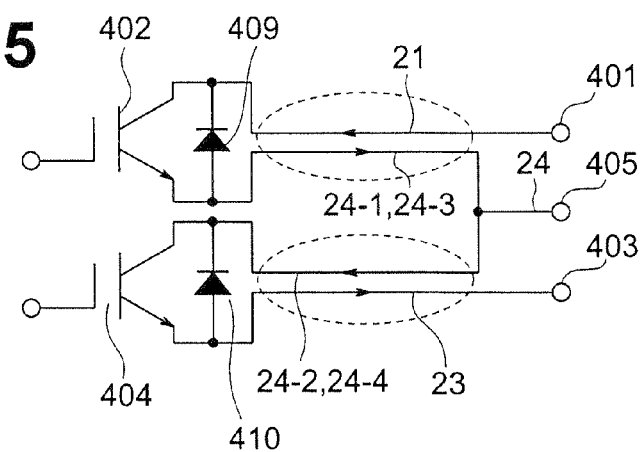
FIG. 5 is a circuit diagram illustrating characteristic relationships of wirings of the IGBT module shown in FIG. 1.

FIG. 5 shows a wiring pathway for the high-voltage bus bar 21, the low-voltage bus bar 23, the output bus bar 24, and the first through fourth metal wiring boards 24-1 through 24-4. The wiring is laid so that the direction of the current flowing in the wiring pathway is reversed in the high-voltage semiconductor chip (the IGBT element 402 and the diode element 409) and in the low-voltage semiconductor chip (the IGBT element 404 and the diode element 410), as is made clear from FIG. 5.

The inductance of the main circuit is significantly reduced due to the aforedescribed configuration of the wiring board pathway of the IGBT module 12, and an effect of non-inductance is generated due to mutual inductance.

An overview of an example method for manufacturing the aforedescribed IGBT module 12 will be given next.

First, a reflow furnace is used to die bond the high-voltage semiconductor chip (the IGBT element 402 and the diode element 409) to the high-voltage bus bar 21, and the low-voltage semiconductor chip (the IGBT element 404 and the diode element 410) to the second metal wiring board 24-2.

Next, the high-voltage bus bar 21 and the second metal wiring board 24-2 are set onto the upper surface of the heat sink 32 via the insulating layer 22.

Next, a wire-bonding jig is set onto the upper surface of the heat sink 32, and the first metal wiring board 24-1 and the low-voltage bus bar 23 are positioned on the wire-bonding jig.

Next, the signal connectors 406, 407 are joined to the upper surface of the heat sink 32.

Next, the main power wire and the signal wire are wire bonded.

Next, the terminals (the high-voltage bus bar, the low-voltage bus bar, and the output bus bar) are set on a terminal-gripping jig, after which the wire-bonding jig is removed.

Finally, resin molding (for the block 11) is performed.

According to the aforedescribed manufacturing method, the first metal wiring board 24-1 and the third metal wiring board 24-3 are both made as separate members, and the second metal wiring board 24-2 and the fourth metal wiring board 24-4 are also both made as separate members, which is advantageous in that wire bonding is therefore easy to perform.

In the description of this embodiment, an N-channel IGBT element was used as the power semiconductor element employed in the semiconductor device. In the relationship between the pair of semiconductor chips placed next to each other in the same plane in this instance, the power semiconductor elements in the semiconductor chips are IGBT elements (N-channel type). In one semiconductor chip, a first surface is the collector-side surface, and the other surface is the emitter-side surface. In the other semiconductor chip, a first surface is the emitter-side surface, and the other surface is the collector-side surface. When any other power semiconductor elements other than IGBT elements are used as the power semiconductor elements, the first side and the other side are the surfaces that correspond functionally to the respective surfaces of the aforedescribed IGBT elements. When using, e.g., an N-channel MOS-FET, the collector of the IGBT element corresponds to the "drain," and the emitter of the IGBT element corresponds to the "source." The conditions above also apply to the embodiments below.

Embodiment 2

A second embodiment of the semiconductor device of the present invention will be described next with reference to FIGS. 6 through 9.

Figure 6:
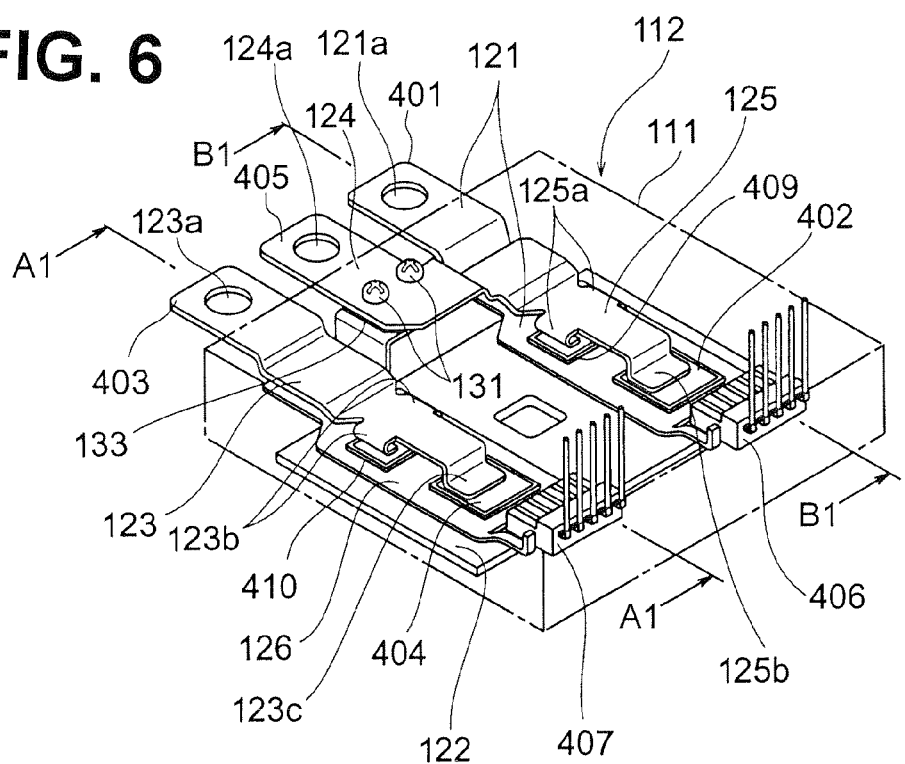
FIG. 6 is a perspective view illustrating a semiconductor device according to a second embodiment of the present invention and, in particular, an external appearance of a modular structure of an IGBT module.

The semiconductor device according to the second embodiment is a power semiconductor device that is an inverter device for driving a three-phase motor that drives a representative electric vehicle, as in the first embodiment. FIG. 6 is similar to the aforedescribed FIG. 1.

The configuration of the electrical circuit of the IGBT module according to the second embodiment is as was described using FIG. 4.

In other words, the electrical circuit portions of a single phase (one phase from among the U, V, or W phases) of the bridge circuit of the inverter device include the high-side IGBT element 402 positioned near the high-voltage terminal 401 and the low-side IGBT element 404 positioned near the low-voltage terminal 403. The bridge circuit of the inverter device is configured using six power semiconductor elements, but one module is formed by a pair of higher and lower power semiconductor elements. The signal connectors 406, 407 are connected between the gates (G) and the emitters (E) of the two IGBT elements 402, 404. The driving-control rectangular pulse signal 408 for turning the IGBT elements 402, 404 on and off at an appropriate timing is input between the input terminals of the signal connectors 406, 407. The rectifying diode elements 409, 410 are connected between the respective emitters (E) and collectors (C) of the two IGBT elements 402, 404.

The physical structure of the IGBT module according to the second embodiment will be described next with reference to FIGS. 6 through 8.

A block 111 shown by the alternatingly dotted line in FIG. 6 designates the external shape of the package that forms the IGBT module 12. The block 111 is substantially molded from resin. The portions designated by solid lines in FIG. 6 are the physical structure portions of the wiring board. The same notation is applied to elements that are substantially identical to the elements of the electrical circuit described using FIG. 4.

In FIG. 6, the portion designated by "401" is the aforedescribed high-voltage terminal, the portion designated by "403" is the aforedescribed low-voltage terminal, and the portion designated by "405" is the aforedescribed output terminal. "406" and "407" are the respective aforedescribed signal connectors. The "402" and "404" portions are the aforedescribed IGBT elements, and the "409" and "410" portions are the aforedescribed diode elements. In FIGS. 6 through 8, the IGBT elements 402, 404 have an upright structure, the emitters and gates are formed on the upper surfaces, the collectors are formed on the lower surfaces, the anodes of the diode elements 409, 410 are formed on the upper surfaces, and the cathodes thereof are formed on the lower surfaces.

The high-voltage terminal 401 constitutes an end portion of a high-voltage bus bar 121 and is the external end portion of the high-voltage bus bar 121 extending to the exterior of the block 111. The high-voltage bus bar 121 is a wiring member that overall has a rectangular plate shape. The high-voltage bus bar is a wiring member that is positioned towards the high-voltage terminal 401. As shown in FIGS. 6 and 8, the high-voltage bus bar 121 is formed in a flat plate shape for a prescribed distance beyond the high-voltage terminal 401 and is bent downwards from the middle. The right-half portion of the high-voltage bus bar in FIG. 8 is also formed in a flat plate shape. As shown in FIG. 8 and the like, a hole 121a is formed located in the high-voltage terminal 401 of the high-voltage bus bar 121, and a right-half portion 121b is fixed onto an insulating layer 122. The insulating layer 122 is, e.g., an epoxy or insulating oxide film.

The low-voltage terminal 403 constitutes an end portion of a low-voltage bus bar 123 and is the external end portion of the low-voltage bus bar 123 extending to the exterior of the block 111. The low-voltage bus bar 123 is also a wiring member that overall has a rectangular plate shape. The low-voltage bus bar is a wiring member that is positioned towards the low-voltage terminal 403. As shown in FIGS. 6 and 7, the low-voltage bus bar 123 is formed in a flat plate shape for a prescribed distance beyond the low-voltage terminal 403, is bent slightly downwards from the middle, and the right-half portion thereof in FIG. 7 is substantially flat-plate shaped. As shown in FIG. 7 and the like, a hole 123a is formed located in the low-voltage terminal 403 of the low-voltage bus bar 123.

The output terminal 405 constitutes an end portion of an output bus bar 124 and is the external end portion of the output bus bar 124 extending to the exterior of the block 111. The output bus bar 124 overall has a substantially rectangular plate shape. The output bus bar 124 is provided as the output end of the end portions of a first metal wiring board 125 and a second metal wiring board 126, which are described hereinafter. A hole 124a is also formed located in the output terminal 405 of the output bus bar 124.

The plate-shaped high-voltage terminal 401 of the high-voltage bus bar 121, the plate-shaped low-voltage terminal 403 of the low-voltage bus bar 123, and the plate-shaped output terminal 405 of the output bus bar 124 in the description above are placed next to each other so as to be positioned in the same plane located on the same side of an IGBT module 112. The output terminal 405 is positioned so as to be located in an intermediate position on the electric current pathway between the high-voltage terminal 401 and the low-voltage terminal 403. The length of the electric current pathway from the high-voltage terminal 401 through the high-side IGBT element 402 to the output terminal 405 and the length of the electric current pathway from the output terminal 405 through the low-side IGBT element 404 to the low-voltage terminal 403 are thereby made substantially equal. The high-side and low-side electrical characteristics are thereby made substantially equal, which is advantageous in terms of improving the output characteristics of the motor. Were the output terminal 405 to be positioned on the opposite side from the high-voltage terminal 401 and the low-voltage terminal 403, the output terminal 405 would have to be bent and extended toward the opposite side. As a result, the member that forms the output terminal would be lengthened, and the length of wiring unrelated to decreasing inductance would be increased; therefore, a drawback is presented in that resistance would increase. The output terminal 405 of the present embodiment is advantageous in being devoid of such a drawback.

The plate shapes of the bus bars of the above-described high-voltage bus bar 121, low-voltage bus bar 123, and output bus bar 124 have a width of, e.g., 20 mm, and a thickness of, e.g., 0.5 mm.

The connectivity relationships of the IGBT elements 402, 404 and the diode elements 409, 410 will be described next.

The high-voltage (high-side) IGBT element 402 and the diode element 409 are attached on top of the high-voltage bus bar 121. The respective lower surfaces of the IGBT element 402 and the diode element 409, i.e., the surface on the collector side of the IGBT element 402 and the surface on the cathode side of the diode element 409, are soldered or otherwise bonded to the high-voltage bus bar 121. The diode element 409 is positioned in a location close to the high-voltage terminal 401, and the IGBT element 402 is positioned in a location far from the high-voltage terminal 401. The high-voltage bus bar 21 is a wiring member that is connected to the high-voltage terminal 401. The cathode of the diode element 409 and the collector of the IGBT element 402 are both electrically connected to the high-voltage bus bar 121. The first metal wiring board 125 is positioned above the diode element 409 and the IGBT element 402. The first metal wiring board 125 is substantially plate-shaped and is connected by soldering to both the anode of the diode element 409 and the emitter and gate of the IGBT element 402. The first metal wiring board 125 and the diode element 409 are electrically connected by lateral strip portions 125a that are bent downwards on both sides, and the first metal wiring board 125 and the IGBT element 402 are electrically connected by an end-portion strip 125b that is bent downwards. An end portion of the first metal wiring board 125 is connected to the output bus bar 124. The first metal wiring board 125 and the output bus bar 124 may be connected by a machine screw or screw fastener 131 or may be bonded by soldering. Ultrasonic bonding or crimping may also be used at this fixation point. The first metal wiring board 125 and the output bus bar 124 may also be made as an integral metal plate.

The low-voltage (low-side) IGBT element 404 and the diode element 410 are attached on top of the second metal wiring board 126 fixed on top of the insulating layer 122 and are positioned in a location below the low-voltage bus bar 123. The respective lower surfaces of the IGBT element 404 and the diode element 410, i.e., the surface on the collector side of the IGBT element 404 and the surface on the cathode side of the diode element 410, are soldered or otherwise bonded to the second metal wiring board 126. The diode element 410 is positioned in a location close to the low-voltage terminal 403, and the IGBT element 404 is positioned in a location far from the low-voltage terminal 403. The low-voltage bus bar 123 is a wiring member that is connected to the low-voltage terminal 403. The low-voltage bus bar 123 is connected to the anode on the upper surface of the diode element 410 and to the emitter and gate on the upper surface of the IGBT element 404 by soldering or the like. The low-voltage bus bar 123 and the diode element 410 are electrically connected by lateral strip portions 123b that are bent downwards on both sides, and the low-voltage bus bar 123 and the IGBT element 404 are electrically connected by an end-portion strip 123c that is bent downwards. The second metal wiring board 126 is substantially plate-shaped and is electrically connected by soldering to both the anode of the diode element 410 and the collector of the IGBT element 404. An end portion of the second metal wiring board 126 is bent and connected to the output bus bar 124. The second metal wiring board 126 and the output bus bar 124 may be connected by a machine screw or screw fastener 131 or may be bonded by soldering. "133" in FIG. 6 designates a blowing-out of the bonding portion when soldering has been performed. Ultrasonic bonding or crimping may also be used at this fixation point, as above. The second metal wiring board 126 may also be made as an integral metal plate together with the output bus bar 124 and the first metal wiring board 125.

According to the aforedescribed structure, the output bus bar 124 is extendedly provided from the first metal wiring board 125 and the second metal wiring board 126.

The positional relationship between the high-side IGBT element 402 and the high-voltage terminal 401 of the diode element 409, and the positional relationship between the low-side IGBT element 404 and the low-voltage terminal 403 of the diode element 410 are relationships of proximity and distance identical to the respective terminals.

In this case, when the semiconductor device is driven so that a greater portion of current flows to the IGBT elements relative to the diode elements, the IGBT element of one semiconductor chip is positioned farther from the high-voltage terminal via the high-voltage bus bar, and the IGBT element of the other semiconductor chip is positioned farther from the low-voltage terminal via the second metal wiring board. On the other hand, when the semiconductor device is driven so that a lesser portion of current flows to the IGBT elements relative to the diode elements, the IGBT element of one semiconductor chip is positioned closer to the high-voltage terminal via the high-voltage bus bar, and the IGBT element of the other semiconductor chip is positioned closer to the low-voltage terminal via the second metal wiring board.

Figure 7:
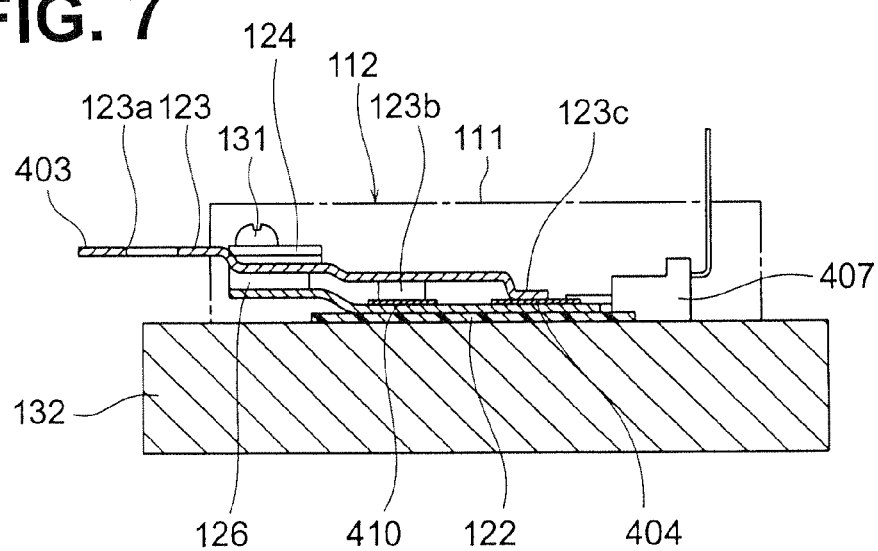
FIG. 7 is a cross-sectional view taken along line A1-A1 of FIG. 6.
Figure 8:
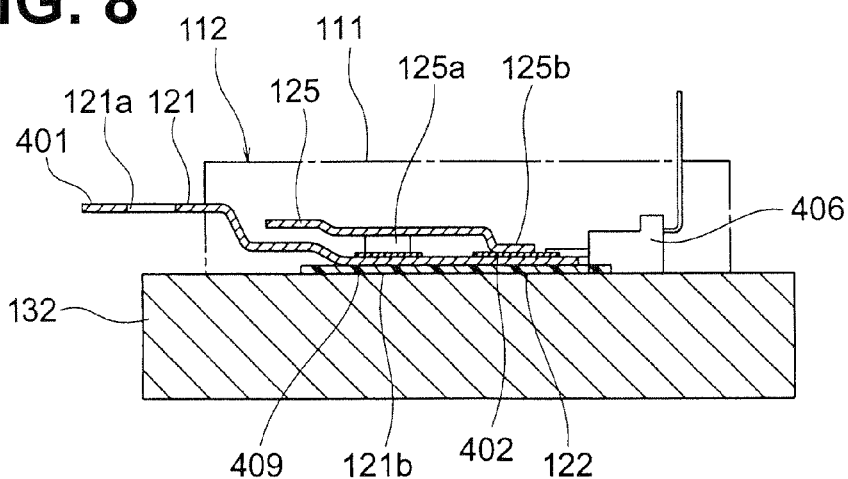
FIG. 8 is a cross-sectional view taken along line B1-B1 of FIG. 6.

A heat sink 132 is provided below the insulating layer 122, i.e., below the block 111 that forms the IGBT module 112, as shown in FIGS. 7 and 8. The heat sink 132 is omitted in FIG. 6.

In the IGBT module 112 having the aforedescribed structure, the diode element 409 and the IGBT element 402 towards the high-voltage terminal 401 form the high-voltage (high-side) semiconductor chip, and the diode element 410 and the IGBT element 404 towards the low-voltage terminal 403 form the low-voltage (low-side) semiconductor chip. The physical positional relationship between the pair of semiconductor chips is such that the semiconductor chips are placed next to each other in the same plane.

In the aforedescribed structure, the first metal wiring board 125 and the second metal wiring board 126, as well as the low-voltage bus bar 123 and the high-voltage bus bar 121, which are positioned parallel to the semiconductor chips, all have a parallel positional relationship, and the distances therebetween are set to be as small as possible. The bus-bar structure of the high-voltage arm and the bus-bar structure of the low-voltage arm have a top-bottom relationship that is reversed relative to the semiconductor chips and have a symmetric positional relationship. The circuit inductance, circuit resistance, and other electrical properties are therefore the same for both the high-voltage arm and the low-voltage arm.

Figure 9:
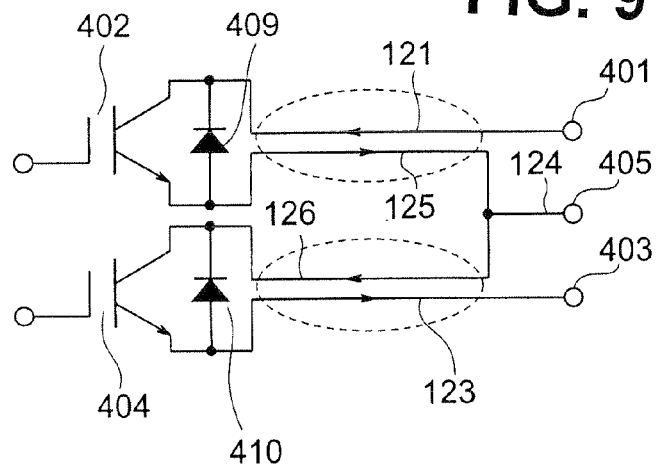
FIG. 9 is a circuit diagram illustrating characteristic relationships of wirings of the IGBT module shown in FIG. 6.

FIG. 9 shows a wiring pathway for the high-voltage bus bar 121, the low-voltage bus bar 123, the output bus bar 124, the first metal wiring board 125, and the second metal wiring board 126. The wiring is laid so that the direction of the current flowing in the wiring pathway is reversed in the high-voltage semiconductor chip (the IGBT element 402 and the diode element 409) and in the low-voltage semiconductor chip (the IGBT element 404 and the diode element 410), as is made clear from FIG. 9.

The inductance of the main circuit is significantly reduced due to the aforedescribed configuration of the wiring board pathway of the IGBT module 112, and an effect of non-inductance is generated due to mutual inductance.

An overview of an example method for manufacturing the aforedescribed IGBT module 112 will be given next. The output bus bar 124 is a two-part type in this example. The output bus bar 124 and the output terminal 405 are therefore formed as extended portions of the first metal wiring board 125 and the second metal wiring board 126.

(1) Setting Step

First, the high-voltage bus bar 121 and the lower surface of the high-voltage semiconductor chip (the IGBT element 402 and the diode element 409) are set using solder paste, and, in addition, the first metal wiring board 125 and the upper surface of that semiconductor chip are set using solder paste.

Next, the second metal wiring board 126 and the lower surface of the low-voltage semiconductor chip (the IGBT element 404 and the diode element 410) are set using solder paste, and, in addition, the low-voltage bus bar 123 and the upper surface of that semiconductor chip are set using solder paste.

Next, the first metal wiring board 125 and the second metal wiring board 126 are set using solder paste. The orientations of the lower surface of the high-voltage bus bar 121 and the lower surface of the second metal wiring board 126 are unified so as to form a uniform surface at this point. A high-precision mount is used as the setting tool in this instance.

(2) Bonding Step

The set material, which was set as described above, is placed in a reflow furnace, where soldering is performed. The elements of the set materials are bonded.

(3) Assembly and Finishing Step

Next, the high-voltage bus bar 121 and the second metal wiring board 126 are set on the upper surface of the heat sink 132 via the insulating layer 122.

Next, the signal connectors 406, 407 are joined to the upper surface of the heat sink 32.

Next, the necessary signal wires are wire-bonded between the signal connectors 406, 407.

Finally, resin molding (for the block 111) is performed.

Figure 10:
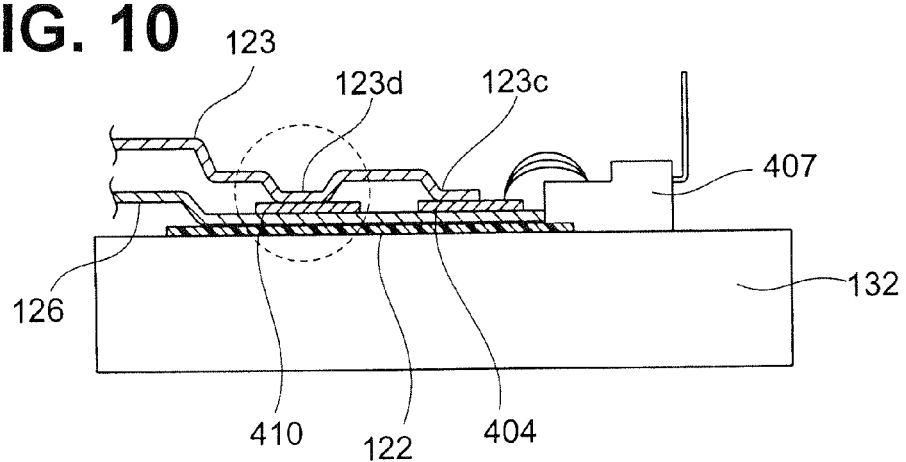
FIG. 10 is a cross-sectional view similar to FIG. 7 but showing main portions of a modification of the semiconductor device according to the second embodiment.

FIG. 10 shows a modification of the semiconductor device according to the second embodiment. FIG. 10 is similar to FIG. 7, and the same notation is applied to elements that are the same as described in the embodiment above. According to the IGBT module of this embodiment, a protruding portion 123d is formed protruding downward from a flat portion of the low-voltage bus bar 123. This protruding portion 123d is connected to the terminal of the diode element 410. The remainder of the structure is the same as the structure described in the embodiment above.

In the description of the embodiment above, the parallel portions of the high-voltage bus bar and the like from the high-voltage terminal and the like to the IGBT elements and the like were lengthened, whereby inductance was reduced, but the parallel portions cannot be lengthened without limit, and are set to the optimal length for the design.

Embodiment 3

An embodiment of the basic configuration of a semiconductor device according to a third embodiment of the present invention will be described with reference to FIGS. 11 through 13. The semiconductor device according to the third embodiment is also used in an inverter device for driving a three-phase motor that drives an electric vehicle, like the previously described embodiments.

The physical structure of the IGBT will be described next with reference to FIGS. 11 through 13.

Figure 11:
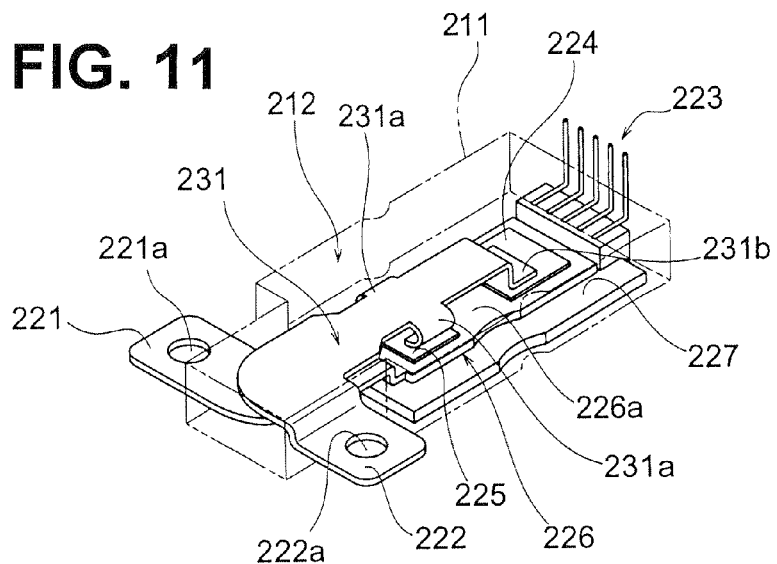
FIG. 11 is a perspective view illustrating a semiconductor device according to a third embodiment of the present invention and, in particular, an external appearance of a modular structure of an IGBT module.
Figure 12:
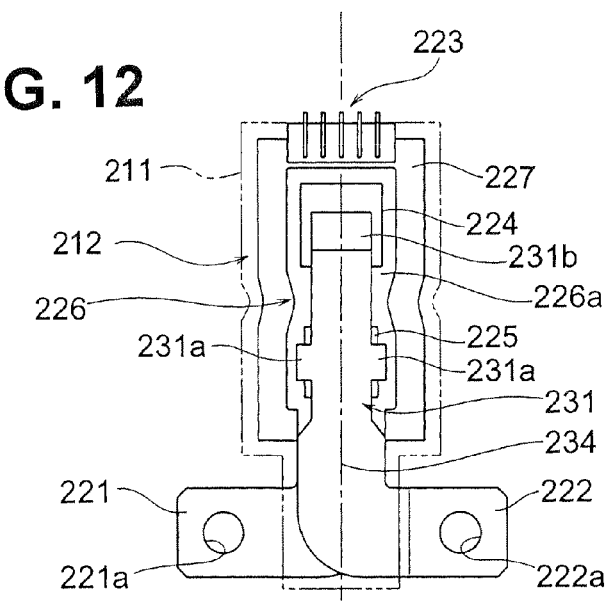
FIG. 12 is a top plan view of the semiconductor device according to the third embodiment.

A block 211 shown by the alternatingly dotted line in FIGS. 11 and 12 designates the external shape of the package that forms an IGBT module 212. The block 211 is substantially molded from resin. The portions designated by solid lines in FIG. 11 are the physical structure portions of the wiring board. The resin mold 211 is shown by broken lines in FIGS. 11 and 12 and by a solid line in FIG. 13.

In FIG. 11, the portion designated by "221" is an input terminal, and the portion designated by "222" is an output terminal. The portion designated by "223" is a signal connector. The portion designated by "224" is an IGBT element, and the portion designated by "225" is a diode element.

In FIG. 11, the IGBT element 224 has an upright structure, the emitters and gates are formed on the upper surfaces, and the collectors are formed on the lower surfaces. The anode of the diode element 225 is formed on the upper surface, and the cathode thereof is formed on the lower surface.

The input terminal 221 constitutes an end portion of an input bus bar 226 and is the external end portion of the input bus bar 26 extending to the exterior of the block 211. The input bus bar 26 is a wiring member that overall has a rectangular plate shape. The input bus bar is a wiring member that is positioned towards the input terminal. As shown in FIGS. 11 and 12, the input terminal 221 is extended on the left-hand side from one end portion of the input bus bar 226 in a direction perpendicular to the lengthwise direction of the input bus bar 226.

The input bus bar 226 is formed in a flat plate shape for a prescribed distance beyond the proximal portion of the input terminal 221 and is bent downwards from the middle, as shown in FIG. 11. A portion 226a on the tip of the input bus bar is also formed in a flat plate shape.

As shown in FIG. 11 and the like, a hole 221a is formed located in the input terminal 221 of the input bus bar 226, and the lower flat-plate portion 226a is fixed onto an insulating layer 227. The insulating layer 227 is, e.g., an epoxy or insulating oxide film.

The output terminal 222 constitutes an end portion of an output bus bar 231 and is the external end portion of the output bus bar 231 extending to the exterior of the block 211. The output bus bar 231 overall has a substantially rectangular shape, and is positioned so as to have a substantially parallel positional relationship with the various portions of the input bus bar 226 on the upper side of the input bus bar 226. A hole 222a is also formed located in the output terminal 222 of the output bus bar 231. As shown in FIGS. 11 and 12, the output terminal 222 is extended on the right-hand side from one end portion of the output bus bar 231 in a direction perpendicular to the lengthwise direction of the output bus bar 231. The output terminal 222 is formed bent so as to form a downward step where the shape is bent to the right at the forward end portion of the output bus bar 231, as shown in FIG. 11 in particular.

Figure 13:
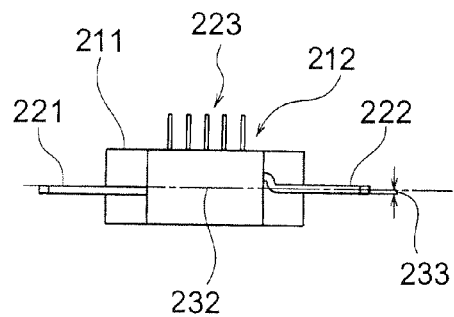
FIG. 13 is a view of FIG. 12 as seen in the direction of arrow A2.

The output terminal 222 of the output bus bar 231 and the aforedescribed input terminal 221 of the input bus bar 226 are formed in a substantially flat positional relationship, as shown in FIG. 13. The flat plate-shaped input terminal 221 and output terminal 222 are both positioned so as to be parallel to a horizontal surface 232 in FIG. 13. The positional relationship of the input terminal 221 and the output terminal 222 in the height-wise direction in this instance is preferably such that the upper surface of the input terminal 221 and the lower surface of the output terminal 222 are both in the same plane 232. The upper surface of the input terminal 221 and the lower surface of the output terminal 222 are also preferably provided so as to produce an overlaid portion (overlap region) 233 in the height-wise direction with respect to the surface 232, as shown in FIG. 13.

The electrical connectivity relationships of the IGBT element 224, the diode element 225, the input bus bar 226, and the output bus bar 231 will be described next.

The IGBT element 224 and the diode element 225 are attached on top of the input bus bar 226. The respective lower surfaces of the IGBT element 224 and the diode element 225, i.e., the surface on the collector side of the IGBT element 224 and the surface on the cathode side of the diode element 225, are soldered or otherwise bonded to the input bus bar 226. The diode element 225 is positioned in a location close to the input terminal 221, and the IGBT element 224 is positioned in a location far from the input terminal 221. The input bus bar 226 is a wiring member that is connected to the input terminal 221. The cathode of the diode element 225 and the collector of the IGBT element 224 are both electrically connected to the IGBT element 224.

The aforedescribed output bus bar 231 is positioned above the diode element 225 and the IGBT element 224. The output bus bar 231 is substantially plate-shaped and is connected by soldering to both the anode of the diode element 225 and the emitter and gate of the IGBT element 224. The output bus bar 231 and the diode element 225 are electrically connected by lateral strip portions 231a that are bent downwards on both sides, and the output bus bar 231 and the IGBT element 224 are electrically connected by an end-portion strip 231b that is bent downwards.

In this case, when the semiconductor device is driven so that a greater portion of current flows to the IGBT element 224 relative to the diode element 225, the IGBT element 224 is positioned farther from the input terminal 21 via the input bus bar 226. On the other hand, when the semiconductor device is driven so that a lesser portion of current flows to the IGBT element 224 relative to the diode element 225, the IGBT element 224 is positioned closer to the input terminal 221 via the input bus bar 226.

A heat sink is in fact provided below the insulating layer 227, i.e., below the block 211 that forms the IGBT module 212, but this heat sink is omitted in FIG. 11 and the like.

The input bus bar 226 and the output bus bar 231 are formed and positioned so as to have line-symmetric shapes relative to a shared center line 234 in a common lengthwise direction when viewed from above, as shown in FIG. 12.

The terms "input terminal 221," "input bus bar 226," "output terminal 222," and "output bus bar 231" were used in the description of the aforedescribed third embodiment, but these terms are used for their descriptive convenience. Either of the two terminals or two bus bars may be used for output or input. In other words, two bus bars, i.e., a first and a second bus bar, may be used in the IGBT module 212 of the present embodiment, and end portions thereof may be used as terminals.

According to the aforedescribed IGBT module 212, a configuration is possible in which a basic unit module is used in manufacturing the inverter device, and power modules having the same structure can be used for the high-voltage arm circuit or the low-voltage arm circuit in the bridge circuit. As a result, the number of components can be reduced, the assembly workforce can be reduced, and significant reductions in cost can be achieved when manufacturing the inverter device.

A modification of the third embodiment of the present invention will be described next with reference to FIGS. 14 through 18.

In the semiconductor device (IGBT module) according to the present embodiment, the aforedescribed basic IGBT module 212 is used as a unit structural element, and the configuration involves combining two of the IGBT modules 212. An IGBT module 241 of the present embodiment is configured by positioning two of the IGBT modules 212 (designated "212A" and "212B" in FIGS. 15 through 18) and the diagrams thereof side by side in the same plane so as to be parallel in the lengthwise direction thereof, and by overlaying and bonding the opposing contacting terminals.

The semiconductor device described in the present embodiment is a power semiconductor device, and is typically an inverter device for driving a three-phase motor that drives an electric vehicle.

The configuration of the electrical circuit of the IGBT module 241 is as shown in FIG. 4.

In other words, the electrical circuit for one phase of the bridge circuit of the inverter device includes the high-side IGBT element 402 positioned near the high-voltage terminal 401 and the low-side IGBT element 404 positioned near the low-voltage terminal 403. The circuit portion that includes the high-side IGBT element 402 is the first arm-circuit portion, and the circuit portion that includes the low-side IGBT element 404 is the second arm-circuit portion. The collector (C) of the IGBT element 402 is connected to the high-voltage terminal 401. The emitter (E) of the IGBT element 402 is connected to the collector (C) of the IGBT element 404, and this connection point is connected to the output terminal 405. The emitter (E) of the IGBT element 404 is connected to the low-voltage terminal 403. Signal connectors 406, 407 are connected between the gates (G) and the emitters (E) of the two IGBT elements 402, 404. A driving-control rectangular pulse signal 408 for turning the IGBT elements 402, 404 on and off at an appropriate timing is input between the input terminals of the signal connectors 406, 407. The rectifying diode elements 409, 410 are connected between the respective emitters (E) and collectors (C) of the two IGBT elements 402, 404.

The physical structure of the IGBT module 241 having the aforedescribed electrical-circuit configuration will be described next with reference to FIGS. 15 through 18.

The IGBT module 241 according to the semiconductor device of the present embodiment is configured by positioning the two IGBT modules 212A, 212B aligned in the same plane so as to be parallel in the lengthwise direction. The two IGBT modules 212A, 212B both have the same structure as the IGBT module 212. The two IGBT modules 212A, 212B are therefore both provided with an input terminal (221), an input bus bar (226), an output terminal (222), an output bus bar (231), a signal connector (223), an IGBT element (224), a diode element (225), an insulating layer (227), a block (211), and the like that were described with reference to FIGS. 11 through 13. The IGBT module 241 according to this embodiment corresponds to the electrical circuit described using FIG. 4, and therefore the same notation is applied to elements corresponding to elements shown in FIG. 4, and the other elements are given the notation shown in FIGS. 11 through 13. A detailed description will be omitted.

Figure 15:
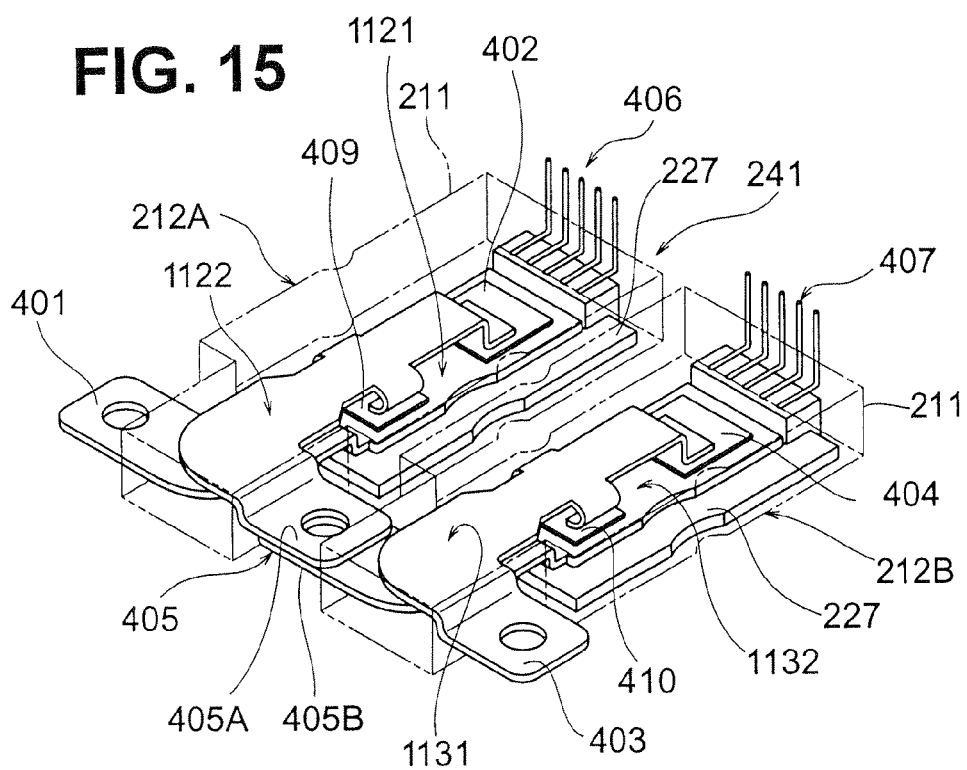
FIG. 15 is a perspective view similar to FIG. 11 but showing a modification of the semiconductor device according to the third embodiment.
Figure 16:
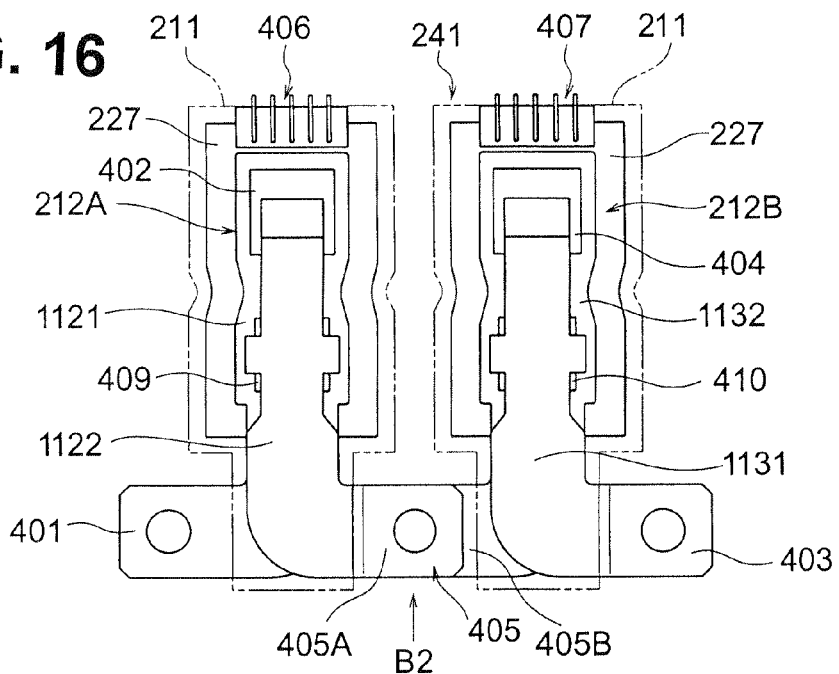
FIG. 16 is a top plan view of an IGBT module shown in FIG. 15.

The IGBT modules 212A, 212B are both covered by the blocks 211, which are resin mold portions, in FIG. 15 and the like.

In the IGBT modules 212A, 212B, the portion designated by "401" is the high-voltage terminal, the portion designated by "403" is the low-voltage terminal, and the portion designated by "405" is the output terminal. "406" and "407" are the respective signal connectors. The "402" and "404" portions are the IGBT elements, and the "409" and "410" portions are the diode elements. The IGBT elements 402, 404 are the same as the aforedescribed IGBT elements 224, and the diode elements 409, 410 are the same as the aforedescribed diode elements 225.

The output terminal 405 above is made by overlaying and bringing into contact the output terminal 405A on side of the IGBT module 212A and the output terminal 405B (equivalent to the input terminal 221 in the IGBT module 212) on the side of the IGBT module 212B.

The IGBT module 212A is provided with a high-voltage bus bar 1121 on the lower side and an output bus bar 1122 on the upper side. The high-voltage bus bar 1121 corresponds to the aforedescribed input bus bar 226, and the output bus bar 1122 corresponds to the aforedescribed output bus bar 231. The high-voltage terminal 401 therefore constitutes an end portion of the high-voltage bus bar 1121 and is the external end portion of the high-voltage bus bar 1121 extending to the exterior of the block 211. The aforedescribed output terminal 405A constitutes an end portion of the output bus bar 1122 and is the external end portion of the output bus bar 1122 extending to the exterior of the block 211. The rest of the structure of the IGBT module 212A is the same as the aforedescribed IGBT module 212.

The IGBT module 212B is provided with a low-voltage bus bar 1131 on the upper side and an output bus bar 1132 on the lower side. The low-voltage bus bar 1131 corresponds to the aforedescribed output bus bar 231, and the output bus bar 1132 corresponds to the aforedescribed input bus bar 226. The low-voltage terminal 403 therefore constitutes an end portion of the low-voltage bus bar 1131 and is the external end portion of the low-voltage bus bar 1131 extending to the exterior of the block 211. The output terminal 405B constitutes an end portion of the output bus bar 1132 and is the external end portion of the output bus bar 1132 extending to the exterior of the block 211. The rest of the structure of the IGBT module 212B is the same as the aforedescribed IGBT module 212.

Figure 17:
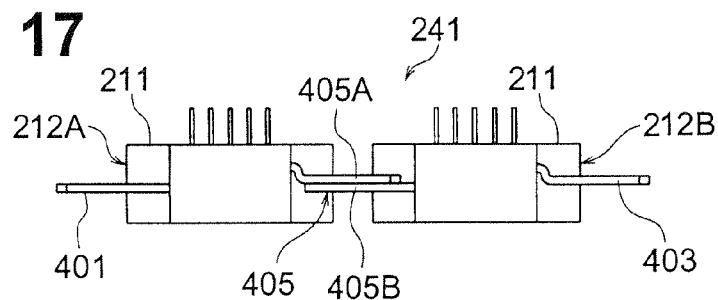
FIG. 17 is a view of FIG. 16 as seen in the direction of arrow B2.
Figure 18:
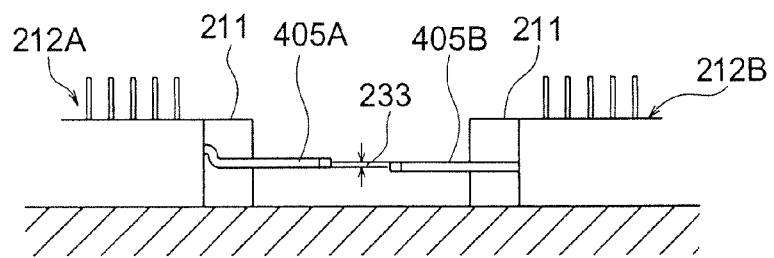
FIG. 18 is an end view showing characteristics of an IGBT module shown in FIG. 15.

The IGBT module 241 is configured so that the two IGBT modules 212A, 212B have the same structure and are aligned. The output terminal 405A and the output terminal 405B of the IGBT module have overlaid portions as described above and as shown in FIG. 18 and are therefore connected in close contact in a pressure-welded state as shown in FIG. 17. In other words, the output terminal 405A of the IGBT module 212A and the output terminal 405B of the IGBT module 212B have an overlapping positional relationship, and the fastening sites are unified into one location. As a result, there are only three connecting locations to the outside portions, the number of connecting locations is reduced, and a two-arm power module can be implemented.

When constructing a power module having two arm circuits, the high-voltage side and the low-voltage side can be configured using IGBT modules having the same structure, bus bars can be used in common, and the output terminals 405 can be fastened in one location. Fewer molds can therefore be used, yield can be improved, the assembly workforce can be reduced, and significant reductions in cost can be achieved. In particular, the output terminals 405A, 405B from the two IGBT modules 212A, 212B are automatically pressed together merely by placing the IGBT modules 212A, 212B in the prescribed positions, and the work of connecting the modules becomes extremely simple.

The output terminal 405 above is positioned so as to be located in an intermediate position on the electric current pathway between the high-voltage terminal 401 and the low-voltage terminal 403. The length of the electric current pathway from the high-voltage terminal 401 through the high-side IGBT element 402 to the output terminal 405 and the length of the electric current pathway from the output terminal 405 through the low-side IGBT element 404 to the low-voltage terminal 403 are thereby made substantially equal. The high-side and low-side electrical characteristics are thereby made substantially equal, which is advantageous in terms of improving the output characteristics of the motor.

The electrical connectivity relationships of the IGBT elements 402, 404 and the diode elements 409, 410 of the IGBT modules 212A, 212B are as described above.

The positional relationship between the high-side IGBT element 402 and the high-voltage terminal 401 of the diode element 409, and the positional relationship between the low-side IGBT element 404 and the low-voltage terminal 403 of the diode element 410 described above are relationships of proximity and distance identical to the respective terminals.

In the IGBT module 241 having the aforedescribed structure, the diode element 409 and the IGBT element 402 towards the high-voltage terminal 401 form the high-voltage (high-side), i.e., first arm-circuit, semiconductor chip, and the diode element 410 and the IGBT element 404 towards the low-voltage terminal 403 form the low-voltage (low-side), i.e., first arm-circuit, semiconductor chip. The physical positional relationship between the pair of semiconductor chips is such that the semiconductor chips are placed next to each other in the same plane.

In the aforedescribed structure, the high-voltage bus bar 1121, the low-voltage bus bar 1131, and the two output bus bars 1122, 1132, which are positioned parallel to the semiconductor chips, all have a parallel positional relationship, and the distances therebetween are set to be as small as possible. The circuit inductance, circuit resistance, and other electrical properties are therefore the same for both the high-voltage arm and the low-voltage arm.

Figure 14:
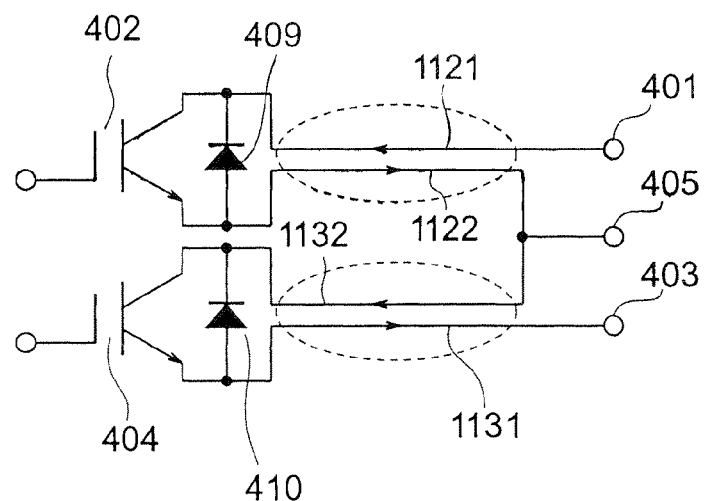
FIG. 14 is a circuit diagram illustrating characteristic relationships of wirings of the IGBT module shown in FIG. 15.

FIG. 14 shows a wiring pathway for the high-voltage bus bar 1121, the low-voltage bus bar 1131, and the output bus bars 1122, 1132. The wiring is laid so that the direction of the current flowing in the wiring pathway is reversed in the high-voltage semiconductor chip (the IGBT element 402 and the diode element 409) and in the low-voltage semiconductor chip (the IGBT element 404 and the diode element 410), as is made clear from FIG. 14.

The inductance of the main circuit is significantly reduced due to the aforedescribed configuration of the wiring board pathway of the IGBT module 241, and an effect of non-inductance is generated due to mutual inductance.

In the description of the third embodiment above, the parallel portions of the high-voltage bus bars and the like from the high-voltage terminals and the like to the IGBT elements and the like were lengthened, whereby inductance was reduced, but the parallel portions cannot be lengthened without limit, and are set to the optimal length for the design.

FIG. 19 shows another modification of the IGBT module 212 shown in FIG. 11. In an IGBT module 251 according to this embodiment, the rear half of the output bus bar 231 is not a plate-shaped member, but is made using a plurality of wires 252. The rest of the configuration is the same as the configuration described using FIG. 11. The same notation is applied to elements in FIG. 19 that are the same as elements described using FIG. 11, and detailed descriptions thereof will be omitted. Operational effects similar to those described for earlier embodiments are also produced by the IGBT module 251 according to this embodiment.

The configuration, shape, size, and arrangement described in the examples above provides an outline that allows the present invention to be understood and implemented, and numbers and compositions (materials) of configurations are merely examples. Therefore, the present invention is not limited to the examples described above, and various modifications can be implemented within a scope that does not depart from the technical concepts designated by the claims.

INDUSTRIAL APPLICABILITY

The present invention can be used as a modular structure of a semiconductor-element of an inverter device for driving a motor that drives an electric vehicle.

The invention claimed is:

1. A semiconductor device comprising:
a first semiconductor chip and a second semiconductor chip that are placed next to each other on a same plane;
a high-voltage bus bar that is bonded to one surface of the first semiconductor chip and that has a high-voltage terminal;
a low-voltage bus bar that is bonded to one surface of the second semiconductor chip and that has a low-voltage terminal;
a first metal wiring board that is bonded to another surface of the first semiconductor chip;
a second metal wiring board that is bonded to another surface of the second semiconductor chip; and
an output bus bar having an output terminal extending from each end portion of the first metal wiring board and of the second metal wiring board, wherein the output terminal is positioned in an intermediate location on an electric current pathway between the high-voltage terminal and the low-voltage terminal.

2. The semiconductor device of claim 1, wherein the high-voltage terminal of the high-voltage bus bar and the low-voltage terminal of the low-voltage bus bar are positioned on same side.

3. The semiconductor device of claim 1 or 2, wherein the first metal wiring board and the second metal wiring board are formed as separate members, and the the output bus bar is bonded to a bonding portion between the first metal wiring board and the second metal wiring board.

4. The semiconductor device of claim 1, wherein a length of an electric current pathway from the high-voltage terminal through the first semiconductor chip to the output terminal, and a length of an electric current pathway from the low-voltage terminal through the second semiconductor chip to the output terminal are substantially equal.

5. The semiconductor device of claim 1, wherein both of the first and second semiconductor chips are provided with a power semiconductor element and a rectifier semiconductor element, when the semiconductor device is driven and current flows to the power semiconductor elements is greater than current flows to the rectifier semiconductor elements, the power semiconductor element of the first semiconductor chip is positioned farther from the high-voltage terminal via the high-voltage bus bar, and the power semiconductor element of the second semiconductor chip is positioned farther from the low-voltage terminal via the second metal wiring board, and when the semiconductor device is driven and current flows to the power semiconductor elements is less than current flows to the rectifier semiconductor elements, the power semiconductor device of the first semiconductor chip is positioned closer to the high-voltage terminal via the high-voltage bus bar, and the power semiconductor element of the second semiconductor chip is positioned closer to the low-voltage terminal via the second metal wiring board.

* * * * *